United States Patent
Tsai et al.

(10) Patent No.: US 11,676,959 B2
(45) Date of Patent: *Jun. 13, 2023

(54) ELECTROSTATIC DISCHARGE PROTECTION CIRCUIT

(71) Applicant: Taiwan Semiconductor Manufacturing Co., Ltd., Hsin-Chu (TW)

(72) Inventors: Ming-Fu Tsai, Hsinchu (TW); Tzu-Heng Chang, New Taipei (TW); Yu-Ti Su, Tainan (TW); Kai-Ping Huang, Hinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,899

(22) Filed: Jun. 9, 2022

(65) Prior Publication Data

US 2022/0302105 A1 Sep. 22, 2022

Related U.S. Application Data

(63) Continuation of application No. 17/098,949, filed on Nov. 16, 2020, now Pat. No. 11,404,409, which is a continuation of application No. 15/893,417, filed on Feb. 9, 2018, now Pat. No. 10,840,237.

(60) Provisional application No. 62/525,651, filed on Jun. 27, 2017.

(51) Int. Cl.
*H01L 27/02* (2006.01)
*H02H 9/04* (2006.01)

(52) U.S. Cl.
CPC ...... *H01L 27/0266* (2013.01); *H01L 27/0285* (2013.01); *H01L 27/0296* (2013.01); *H02H 9/046* (2013.01)

(58) Field of Classification Search
CPC ............. H01L 27/0266; H01L 27/0285; H01L 27/0296; H02H 9/046; H02H 9/04
USPC .......................................................... 361/56
See application file for complete search history.

(56) References Cited

U.S. PATENT DOCUMENTS

| | | | | |
|---|---|---|---|---|
| 8,743,515 B2* | 6/2014 | Yang | ...................... | H02H 9/046 361/56 |
| 9,184,586 B2* | 11/2015 | Wang | ..................... | H02H 9/046 |
| 2003/0227726 A1* | 12/2003 | Chen | ................... | H01L 27/0251 361/111 |
| 2008/0106834 A1* | 5/2008 | Hung | ..................... | H02H 9/046 361/56 |
| 2011/0299202 A1* | 12/2011 | Cai | ........................ | H02H 9/046 361/56 |

(Continued)

*Primary Examiner* — Dharti H Patel
(74) *Attorney, Agent, or Firm* — Duane Morris LLP (57) ABSTRACT

An electrostatic discharge (ESD) protection circuit is coupled between first and second power supply buses. The ESD protection circuit includes a detection circuit; a pull-up circuit, coupled to the detection circuit, comprising at least a first n-type transistor; a pull-down circuit, coupled to the pull-up circuit, comprising at least a second n-type transistor; and a bypass circuit, coupled to the pull-up and pull-down circuits, wherein the detection circuit is configured to detect whether an ESD event is present on either the first or the second bus so as to cause the pull-up and pull-down circuits to selectively enable the bypass circuit for providing a discharging path between the first and second power supply buses.

20 Claims, 8 Drawing Sheets

(56) References Cited

U.S. PATENT DOCUMENTS

| | | | |
|---|---|---|---|
| 2013/0182356 A1* | 7/2013 | Yang | H02H 9/046 361/56 |
| 2013/0258533 A1* | 10/2013 | Chen | H02H 9/046 361/56 |
| 2013/0342941 A1* | 12/2013 | Wang | H02H 9/046 29/825 |
| 2018/0082992 A1* | 3/2018 | Mertens | H01L 23/60 |

* cited by examiner

Figure 7

ELECTROSTATIC DISCHARGE PROTECTION CIRCUIT

CROSS-REFERENCE TO RELATED APPLICATION

This application is a continuation of U.S. patent application Ser. No. 17/098,949, filed Nov. 16, 2020, which is a continuation application of U.S. patent application Ser. No. 15/893,417, filed Feb. 9, 2018, which claims priority to U.S. Provisional Patent Application No. 62/525,651, filed on Jun. 27, 2017, each of which are incorporated by reference herein in their entireties.

BACKGROUND

Electrostatic discharge (ESD) damage/stress has become a significant reliability concern for integrated circuits (IC's). Such ESD stress may be induced through, for example, human touch, a sudden electric surge, etc. Moreover, while complementary-metal-oxide-semiconductor (CMOS) technologies have enabled fabrication of devices in the scale of 32 nanometers (nm) or smaller, such scaled-down CMOS devices and corresponding thinner gate dielectric layers become more vulnerable to ESD stress. By a general industrial standard, input and output pins (or pads) of modern IC's are typically required to sustain human-body-model ESD stress of a value about 2000 volts (V). In this regard, an ESD protection circuit is generally placed around the input and/or output pads of modern IC's in order to protect the IC's against the ESD stress.

Further, the number of applications that require the IC's to operate under high voltage levels or negative voltage levels, for example, automotive-related applications, internet of things (IoT) applications, bio-related applications, analog-circuit applications, etc., has been rapidly increasing. In order to accommodate such applications, one or more cascaded ESD protection circuits can be implemented in IC's to detect and provide protection against ESD events. Conventionally, each of the cascaded ESD protection circuits may include at least a p-type device (e.g., a p-type MOSFET) as part of a pull-up circuit and an n-type device (e.g., an n-type MOSFET) as part of a pull-down circuit that are used to selectively turn on and off a bypass ESD circuit, respectively, based on whether an ESD event is detected. Also, due to concerns of real estate allocation to fabricate such a cascaded ESD protection circuit, an additional n-type well is typically required for the p-type MOSFET to be formed therein, and such an n-type well is commonly coupled to a voltage level that is substantially higher than a nominal operation voltage, e.g., VDD. This generally causes various reliability issues on the ESD protection circuit such as, for example, a high voltage drop across the p-type MOSFET that leads to a breakdown of the p-type MOSFET (i.e., the aforementioned pull-up circuit), etc.

Thus, there exists a need to provide an ESD protection circuit that can be used in such high voltage level and/or negative voltage level applications without suffering the above-mentioned issues.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a cascaded electrostatic discharge (ESD) protection circuit that uses n-type MOSFET's to form its respective pull-up and pull-down circuits. As such, the above-mentioned issues may be advantageously avoided. More specifically, the disclosed cascaded ESD protection circuit uses two n-type MOSFET's and a resistor to form the pull-up circuit. By replacing the conventional p-type MOSFET with such n-type MOSFET's, the n-type MOSFET's of the pull-up circuit may be formed in a same p-type well together with other circuit elements of the cascaded ESD protection circuit above a common deep n-type well, which advantageously increases respective breakdown voltages of the n-type MOSFET's (of both the pull-up and pull-down circuits) while requiring no further real estate allocation during fabrication stages. Further, in some embodiments, a plurality of the disclosed cascaded ESD protection circuits may be coupled to one another to form a multi-stage ESD protection circuit that can be used in some high voltage applications (e.g., multi-VDD applications).

Figure 1:
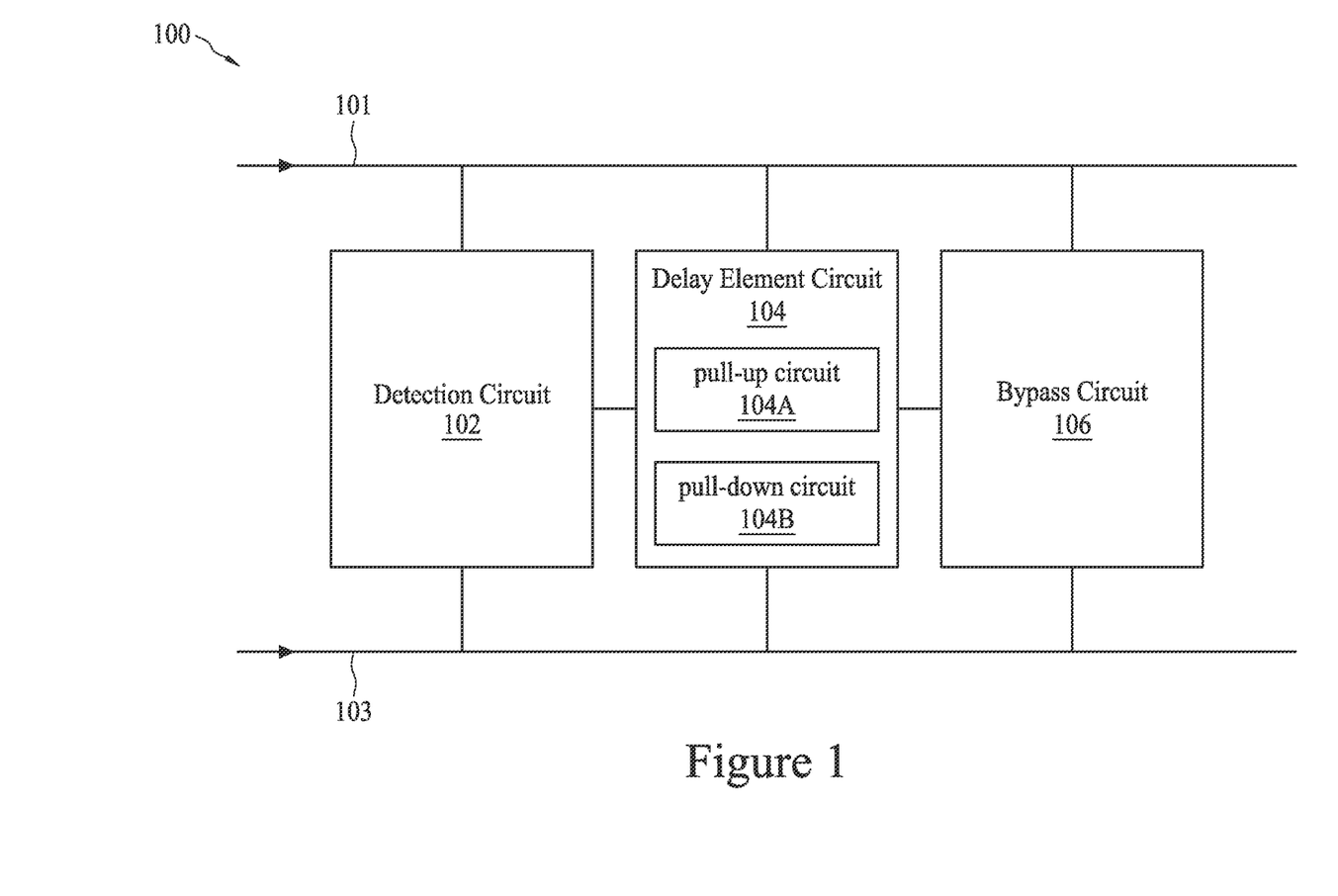
FIG. 1 illustrates an exemplary block diagram of a cascaded electrostatic discharge (ESD) protection circuit, in accordance with some embodiments.

FIG. 1 illustrates an exemplary block diagram of a cascaded ESD protection circuit 100, in accordance with some embodiments. The cascaded ESD protection circuit 100

(hereinafter "ESD circuit 100") includes a detection circuit 102, a delay element circuit 104, and a bypass circuit 106, wherein the detection circuit 102, the delay element 104, and the bypass 106 are respectively coupled between a first power supply bus 101 and a second power supply bus 103. As shown, in some embodiments, the detection circuit 102 is coupled to the delay element circuit 104, and the delay element circuit 104 is further coupled to the bypass circuit 106.

As mentioned above, an ESD protection circuit is typically disposed around (coupled to) an input/output (I/O) pad of an internal circuit that is configured to be protected by the ESD protection circuit. As such, when an ESD event (e.g., an ESD zap, an ESD pulse, etc.) is induced from the I/O pad and through a power supply bus, the ESD protection circuit may provide one or more discharging paths to allow the ESD event to be routed such that the ESD event will bypass the internal circuit. Accordingly, it is understood by people of ordinary skill in the art that the disclosed ESD circuit 100 may be coupled to one or more to-be protected internal circuits (e.g., a processor circuit, a memory circuit, etc.) and respective I/O pads, which are not shown in FIG. 1 for purposes of clarity, through the first and/or second power supply bus (101 and/or 103).

In some embodiments, the first power supply bus 101 may be configured to deliver a first supply voltage, e.g., VDD. Accordingly, the first power supply bus 101 is herein referred to as "VDD bus 101." And the second power supply bus 103 may be configured to deliver a second supply voltage, e.g., VSS. Accordingly, the second power supply bus 103 is herein referred to as "VSS bus 103." The detection circuit 102 is configured to detect whether an ESD event (e.g., an ESD zap, an ESD pulse, etc.) is present and, more specifically, propagated through either the VDD bus 101 or the VSS bus 103. In some embodiments, the delay element circuit 104 further includes a pull-up circuit 104A and a pull-down circuit 104B. The pull-up circuit 104A and the pull-down circuit 104B are configured to selectively enable/disable the coupled bypass circuit 106 based on whether an ESD event is detected (by the detection circuit 102). In some embodiments, once the bypass circuit 106 is enabled, the detected ESD event may be routed through the bypass circuit 106 to avoid causing ESD damage to the coupled internal circuit (not shown). On the other hand, when the bypass circuit 106 is disabled, the ESD circuit 100 may operate transparently so as to allow the VDD or VSS to be delivered through the respective VDD bus 101 or the VSS bus 103 to an intended destination, e.g., an internal circuit (not shown). Exemplary embodiments of the ESD circuit 100 and its operation will be discussed in further detail below with respect to FIGS. 3A and 3B.

Figure 2:
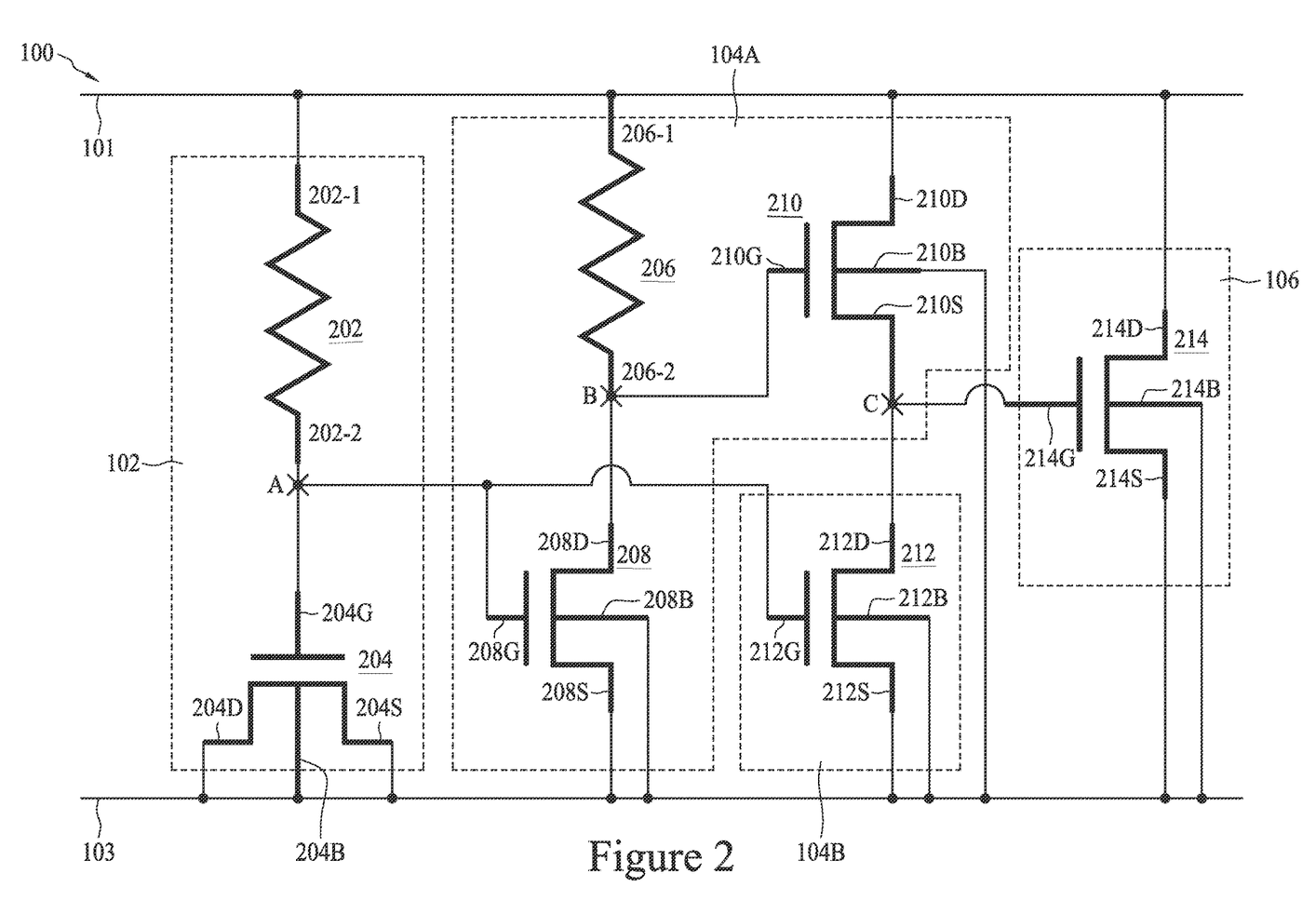
FIG. 2 illustrates an exemplary circuit diagram of the cascaded ESD protection circuit of FIG. 1, in accordance with some embodiments.

FIG. 2 illustrates an exemplary circuit diagram of the ESD circuit 100, in accordance with some embodiments. Each of the detection circuit 102, the pull-up circuit 104A, the pull-down circuit 104B, and the bypass circuit 106 will be respectively described below. The detection circuit 102 includes a resistor 202 and a transistor 204; the pull-up circuit 104A includes a resistor 206, and transistors 208 and 210; the pull-down circuit 104B includes a transistor 212; and the bypass circuit 106 includes a transistor 214. In accordance with some embodiments of the present disclosure, the transistors 204, 206, 208, 210, 212, and 214 may each be implemented as an n-type metal-oxide-semiconductor (NMOS) field-effect-transistor (FET). However, it is noted that the transistors 204, 206, 208, 210, 212, and 214 may each be implemented as any of various types of n-type transistors (e.g., a bipolar junction transistor (BJT), a high-electron mobility transistor (HEMT), etc.) while remaining within the scope of the present disclosure.

More specifically in the illustrated embodiment of FIG. 2, regarding the detection circuit 102, the resistor 202 is coupled to the VDD bus 101 by one end (e.g., 202-1), and to the transistor 204 by the other end (e.g., 202-2) at node "A." The transistor 204 includes four ends: gate end 204G, source end 204S, drain end 204S, and body end 204B. More specifically, in some embodiments, the gate end 204G is coupled to the resistor 202 at the node A, and the drain, source, and body ends (204D, 204S, and 204B) are respectively coupled to the VSS bus 103. As such, the transistor 204 may function as a capacitor, which will be described in further detail below.

Regarding the pull-up circuit 104A, the resistor 206 is coupled to the VDD bus 101 by one end (e.g., 206-1), and to the transistor 208 by the other end (e.g., 206-2) at node "B." The transistor 208 includes four ends: gate end 208G, source end 208S, drain end 208S, and body end 208B. More specifically, in some embodiments, the gate end 208G is coupled to the node A; the drain end 208D is coupled to the resistor 206 at the node B; and the source and body ends (208B, and 208B) are respectively coupled to the VSS bus 103. The transistor 210 includes four ends: gate end 210G, source end 210S, drain end 210S, and body end 210B. More specifically, in some embodiments, the gate end 210G is coupled to the node B; the drain end 210D is coupled to the VDD bus 101; the body end 210B is coupled to the VSS bus 103; and the source end 210S is coupled to the transistor 212 of the pull-down circuit 104B at node "C."

Regarding the pull-down circuit 104B, the transistor 212 includes four ends: gate end 212G, source end 212S, drain end 212S, and body end 212B. More specifically, in some embodiments, the gate end 212G is coupled to the node A and also to the gate end 208G of the transistor 208; the drain end 212D is coupled to the transistor 210 at the node C; and the body and source ends (212B and 212S) are respectively coupled to the VSS bus 103.

Regarding the bypass circuit 106, the transistor 214 includes four ends: gate end 214G, source end 214S, drain end 214S, and body end 214B. More specifically, in some embodiments, the gate end 214G is coupled to the transistors 210 and 212 at the node C; the drain end 214D is coupled to the VDD bus 101; and the body and source ends (214B and 214S) are respectively coupled to the VSS bus 103.

As mentioned above, in some embodiments, each element (e.g., 202 to 214) of the ESD circuit 100 can be formed above a single deep n-type well (hereinafter "DNW"), or also referred to as an n-type buried layer (NBL), so as to provide more robust ESD protection. However, in contrast to conventional cascaded ESD protection circuits, the ESD circuit 100 includes no p-type transistor (or p-type conduction device), in accordance with some embodiments. Thus, the breakdown issue of the p-type transistor, as mentioned above, may be advantageously avoided. An illustrated example showing a cross-sectional view of a portion of the ESD circuit 100 at a semiconductor fabrication level is provided and discussed below with respect to FIG. 7.

Figure 3A:
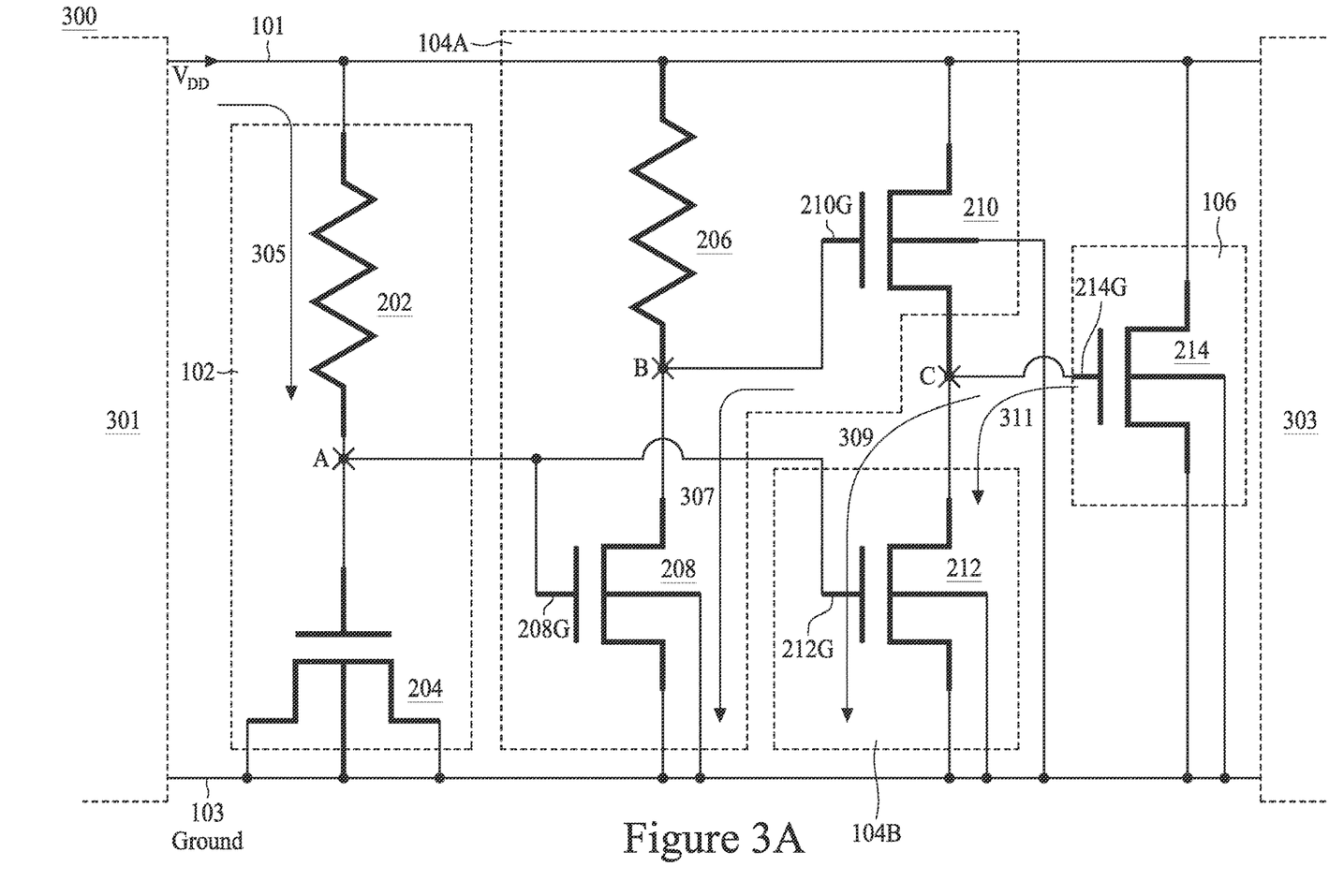
FIG. 3A illustrates an exemplary scenario when the cascaded ESD protection circuit of FIG. 1 operates under a normal operation mode, in accordance with some embodiments.
Figure 3B:
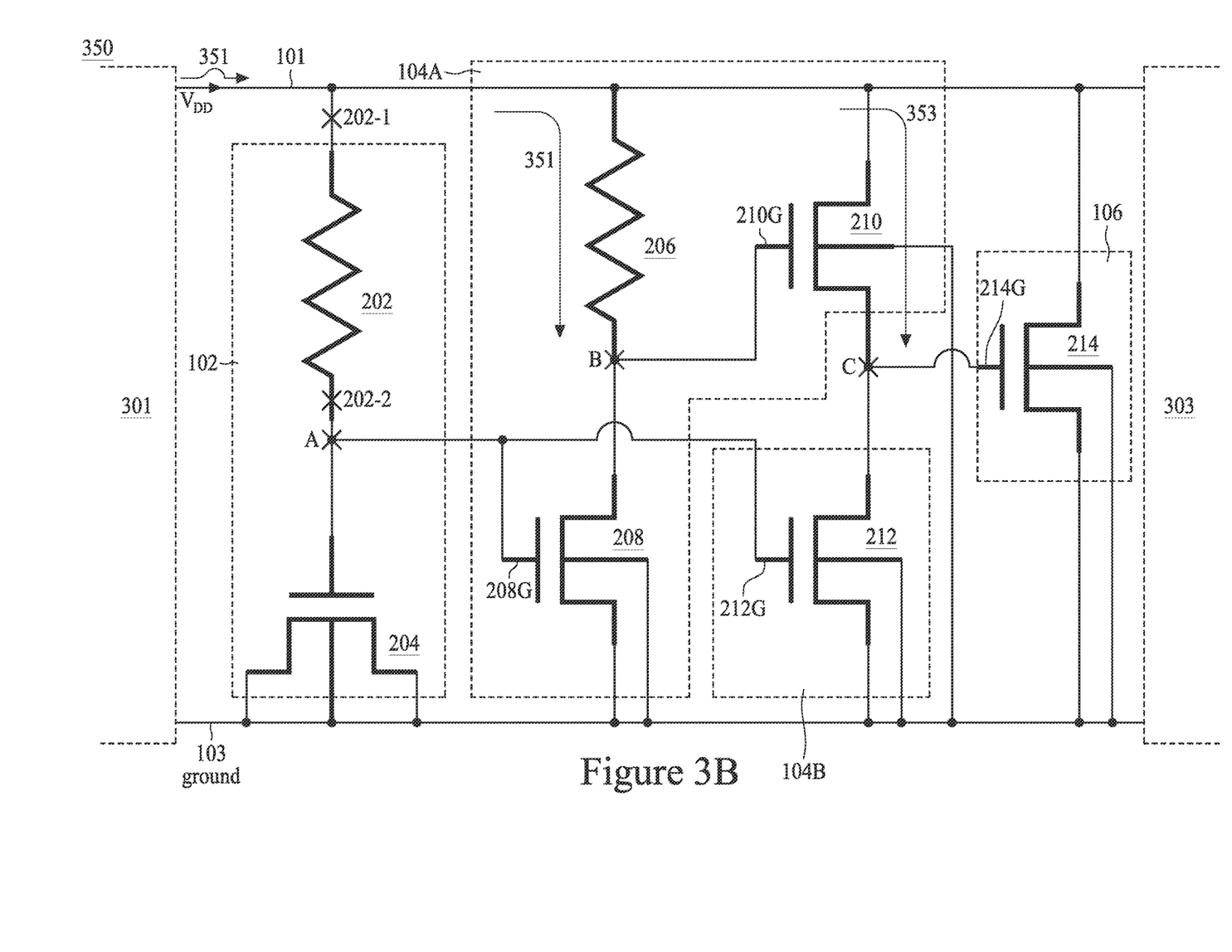
FIG. 3B illustrates an exemplary scenario when the cascaded ESD protection circuit of FIG. 1 operates under an ESD routing mode, in accordance with some embodiments.

FIGS. 3A and 3B use the circuit diagram of FIG. 2 to illustrate operations of the ESD protection circuit 100 when no ESD event is detected and when an ESD event is detected, respectively. Thus, it is understood that each of the FIGS. 3A and 3B is substantially similar to the circuit diagram of FIG. 2 for purposes of explanation.

FIG. 3A provides an exemplary scenario 300 illustrating how the ESD circuit 100 operates when no ESD event is detected, i.e., the ESD circuit 100 operates under a normal operation mode. As mentioned above, the detection circuit 102 formed by the resistor 202 and the transistor 204 is configured to detect whether an ESD event is detected. Such an ESD event is typically provided in a form of a pulse signal and propagated through the VDD bus 101. That is, when no ESD event occurs, in some embodiments, the VDD bus 101 may continuously provide the VDD while the ESD circuit 100 operates "transparently" under the normal operation mode. During the normal operation mode, the ESD circuit 100 is configured to transparently pass the VDD received from a coupled circuit/component 301 (e.g., a I/O pad) to a coupled circuit/component 303 (e.g., an internal circuit that is configured to receive the VDD) through the VDD bus 101, and the VSS bus 103 may provide a ground voltage.

More specifically, in some embodiments, when the detection circuit 102 determines that no ESD event is present, the detection circuit 102 may cause the pull-up circuit 104A and the pull-down circuit 104B to respond accordingly so as to disable the bypass circuit 106. As such, the VDD is allowed to be transparently propagated through the VDD bus 101. Detailed operations of each of the detection circuit 102, the pull-up circuit 104A, the pull-down circuit 104B, and the bypass circuit 106 under the normal operation mode, in accordance with some embodiments, are described below.

When the VDD, received from the I/O pad 301, includes no ESD pulse signal, the VDD may charge the node A through the resistor 202 so as to increase a voltage level at the node A to be about the same as the VDD, which is symbolically represented by arrow 305 in FIG. 3A. After the voltage level at the node A is charged to the VDD, which corresponds to a high logic state (hereinafter "HIGH"), the transistors 208 and 212 are turned on because the respective gates 208G and 212G are pulled to HIGH, respectively. As such, a voltage level at node B is pulled to a low logic state (hereinafter "LOW"), which is symbolically represented by arrow 307 in FIG. 3A. Once the voltage level at node B is pulled to LOW, the transistor 210 is turned off since the respective gate 210G is pulled to LOW. Accordingly, since the transistor 210 is turned off and the transistor 212 is turned on, a voltage level at the node C is pulled to LOW, which is symbolically represented by arrow 309 in FIG. 3A. When the voltage level at the node C is pulled to LOW (under the scenario that the transistors 210 and 212 are turned off and on, respectively), the transistor 214 is turned off because the respective gate 214G is pulled to LOW, which is symbolically represented by arrow 311 in FIG. 3A.

FIG. 3B provides an exemplary scenario 350 illustrating how the ESD circuit 100 operates when an ESD event is detected, i.e., the ESD circuit 100 operates under an ESD routing mode. As mentioned above, the ESD event is typically provided as a pulse signal through either the VDD bus 101 or the VSS bus 103. In the illustrated embodiment of FIG. 3B, an ESD pulse signal 351 is received from the I/O pad 301 through the VDD bus 101.

In the illustrated embodiment of FIG. 3B, when the detection circuit 102 determines that the ESD pulse signal 351 is present on the VDD bus 101, the detection circuit 102 may cause the pull-up circuit 104A and the pull-down circuit 104B to respond accordingly so as to enable the bypass circuit 106. As such, the ESD pulse signal 351 may be discharged to ground through the bypass circuit 106. Detailed operations of each of the detection circuit 102, the pull-up circuit 104A, the pull-down circuit 104B, and the bypass circuit 106 under the ESD routing mode, in accordance with some embodiments, are described below.

When the ESD pulse signal 351 is present on the VDD bus 101 together with the VDD, a voltage level at the end 202-1 of the resistor 202 may be suddenly pulled to HIGH. However, the voltage level at the node A as well as the voltage at the end 202-1 of the resistor 202 may not rise as quickly as the voltage level at the end 202-1 because of a resistor-capacitor (RC) delay that is caused when the voltage level at the node A is at LOW. More specifically, such an RC delay may be provided by the capacitor (formed by the transistor 204) and the resistor 202. Since the voltage level at the node A is at LOW, which pulls the gates 208G and 212G to LOW, the transistors 208 and 212 are turned off. As mentioned above, the capacitor 204 may be formed by shunting the drain end 204D, the source end 204S, and the body end 204B of the transistor 204 together. Simultaneously or subsequently, the voltage level at the node B may be charged to HIGH through the resistor 206, which is symbolically represented by arrow 351 in FIG. 3B. Accordingly, the transistor 210 is turned on because the gate 210G is pulled to HIGH. After the transistor 210 is turned on while the transistor 212 remains in the OFF state, the voltage level at the node C may be charged to HIGH through the transistor 210, which is symbolically represented by arrow 353 in FIG. 3B. As such, the transistor 214 is turned on because the gate 214G is pulled to HIGH. Thus, the ESD pulse signal 351 may be routed (e.g., discharged) through the transistor 214 (i.e., the bypass circuit 106) to ground (i.e., VSS bus 103) while the VDD can still be delivered to the internal circuit 303 without such an ESD pulse signal 351.

Figure 4:
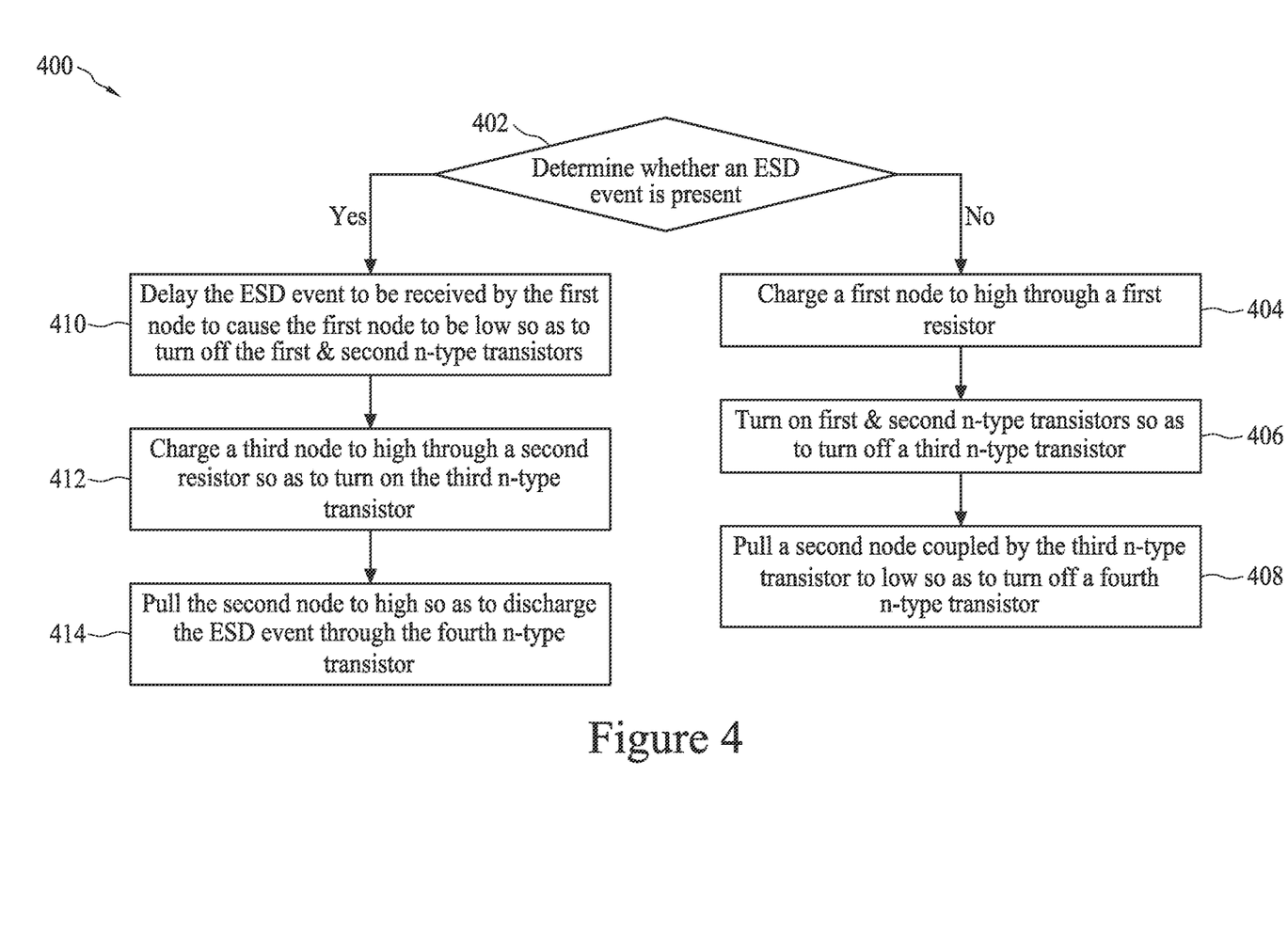
FIG. 4 illustrates an exemplary flow chart of a method to operate the cascaded ESD protection circuit of FIG. 1, in accordance with some embodiments.

FIG. 4 illustrates an exemplary flow chart of a method 400 to operate the ESD circuit 100, in accordance with some embodiments. In various embodiments, the operations of the method 400 are performed by the respective components illustrated in FIGS. 1-3B. For purposes of discussion, the following embodiment of the method 400 will be described in conjunction with FIGS. 1-3B. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which a presence of an ESD event is detected by the ESD circuit 100, in accordance with various embodiments. In the above example of FIGS. 3A and 3B, the detection circuit 102 of the ESD circuit 100 is configured to detect whether an ESD pulse signal is present with the VDD on the VDD bus 101. If no such ESD pulse signal is present, the method 400 proceeds to operations 404, 406 and 408. However, if an ESD pulse signal (e.g., 351) is present along with the VDD on the VDD bus 101, the method 400 proceeds to operations 410, 412, and 414. Both routes of the method 400 will be discussed below, respectively.

If no ESD pulse signal is detected at operation 402, the method 400 continues to operation 404 in which a first node of the ESD circuit 100 is charged to HIGH through a first resistor of the ESD circuit 100, in accordance with various embodiments. More specifically, continuing with the above example, the first node, e.g., the node A, may be charged through the resistor 202 (the first resistor) to a voltage level that is substantially close the VDD, which corresponds to HIGH.

The method 400 continues to operation 406 in which a first n-type transistor and a second n-type transistor are turned on, and a third n-type transistor is turned off, in accordance with various embodiments. Still with the same example, since the node A is pulled to HIGH, the transistors 208 (the first n-type transistor) and 212 (the second n-type transistor) are turned on. Since the transistor 208 is turned on, the gate 210G of the transistor 210 (the third n-type transistor) is pulled to LOW through the transistor 208 so that the transistor 210 is turned off.

The method 400 continues to operation 408 in which a second node coupled to the second and third n-type transistors is pulled to LOW, and a fourth n-type transistor is turned off, in accordance with various embodiments. Still with the same example, since the transistor 212 (the second n-type transistor) is turned off and the transistor 210 (the third n-type transistor) is turned on, the second node, e.g., the node C, is pulled to LOW through the turned-off transistor 212. As such, the transistor 214 (the fourth n-type transistor) is turned off. Accordingly, the VDD propagated on the VDD bus 101 may be delivered to a coupled circuit, e.g., 303.

If an ESD pulse signal (e.g., the ESD pulse signal 351) is detected at operation 402, the method 400 continues to operation 410 in which the ESD pulse signal 351 is delayed before it is received by the first node to cause the first node to be LOW such that the first and second n-type transistors are turned off, in accordance with various embodiments. Still with the same example, because of the RC delay provided by the resistor 202 and the capacitor/transistor 204, the node A (the first node) may not be pulled to HIGH instantly, i.e., the node A is at LOW. As such, the transistors 208 (the first n-type transistor) and 212 (the second n-type transistor) are turned off.

The method 400 continues to operation 412 in which a third node is charged to HIGH through a second resistor of the ESD circuit 100 such that the third n-type transistor is turned on, in accordance with various embodiments. Continuing with the above example, the third node, e.g., the node B, is charged to HIGH through the resistor 206 (the second resistor). As such, the gate 210G of the transistor 210 (the third n-type transistor), coupled to the node B, is pulled to HIGH so that the transistor 210 is turned on.

The method 400 continues to operation 414 in which the second node is pulled to HIGH such that the fourth n-type transistor is turned on to discharge the ESD event, in accordance with various embodiments. Continuing with the above example, since the transistor 210 is turned on so that the node C (the second node), coupled to the gate 214G of the transistor 214 (the fourth n-type transistor), is pulled to HIGH. Accordingly, the transistor 214 is turned on. In some embodiments, when the transistor 214 is turned on, the ESD pulse signal 351 present on the VDD bus 101 may be discharged to ground through the transistor 214 while the VDD can still be provided to the coupled circuit 303.

Figure 5:
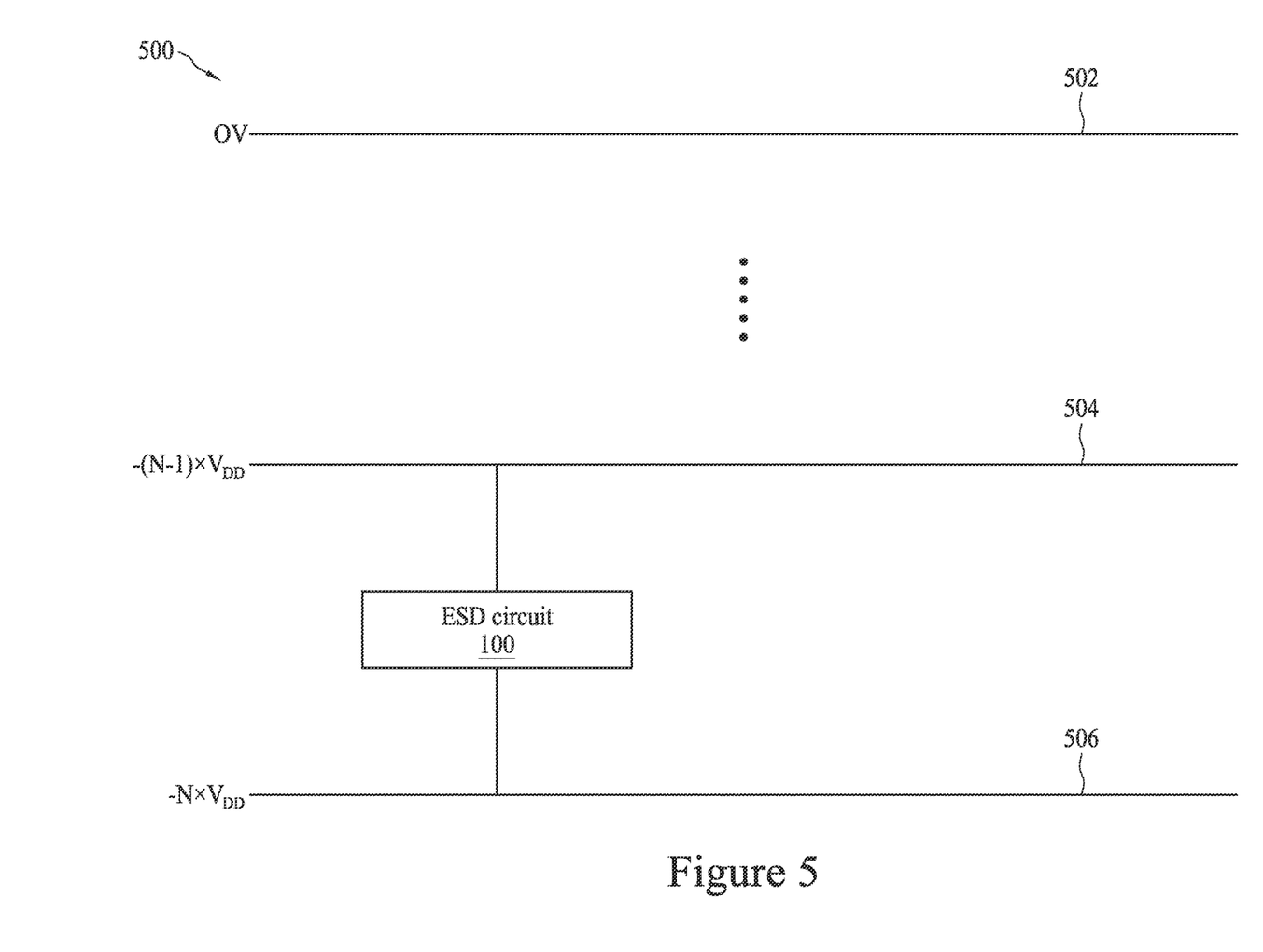
FIG. 5 illustrates an exemplary block diagram of a negative voltage level application in which the cascaded ESD protection circuit of FIG. 1 is used, in accordance with some embodiments.

FIG. 5 illustrates an exemplary block diagram showing the ESD circuit 100 can be used in a negative voltage level application 500, in accordance with some embodiments. As shown, such a negative voltage level application 500 may include plural power supply buses, e.g., 502, 504, and 506, wherein the power supply bus 502 may be configured to provide a ground voltage (e.g., 0 vole (V)), the power supply bus 504 may be configured to provide a negative voltage (e.g., $-(N-1) \times VDD$), and the power supply bus 506 may be configured to provide another negative voltage (e.g., $-N \times VDD$). In some embodiments, "N," as used herein, may be a positive integer or fraction. Thus, it is understood by people of ordinary skill in the art that although only three power supply buses are shown in FIG. 5, any desired number of power buses may be included in the negative voltage level application 500. When used in such a negative voltage level application 500, in some embodiments, the ESD circuit 100 may be coupled between two adjacent power supply buses, for example, 504 and 506 as shown.

Figure 6:
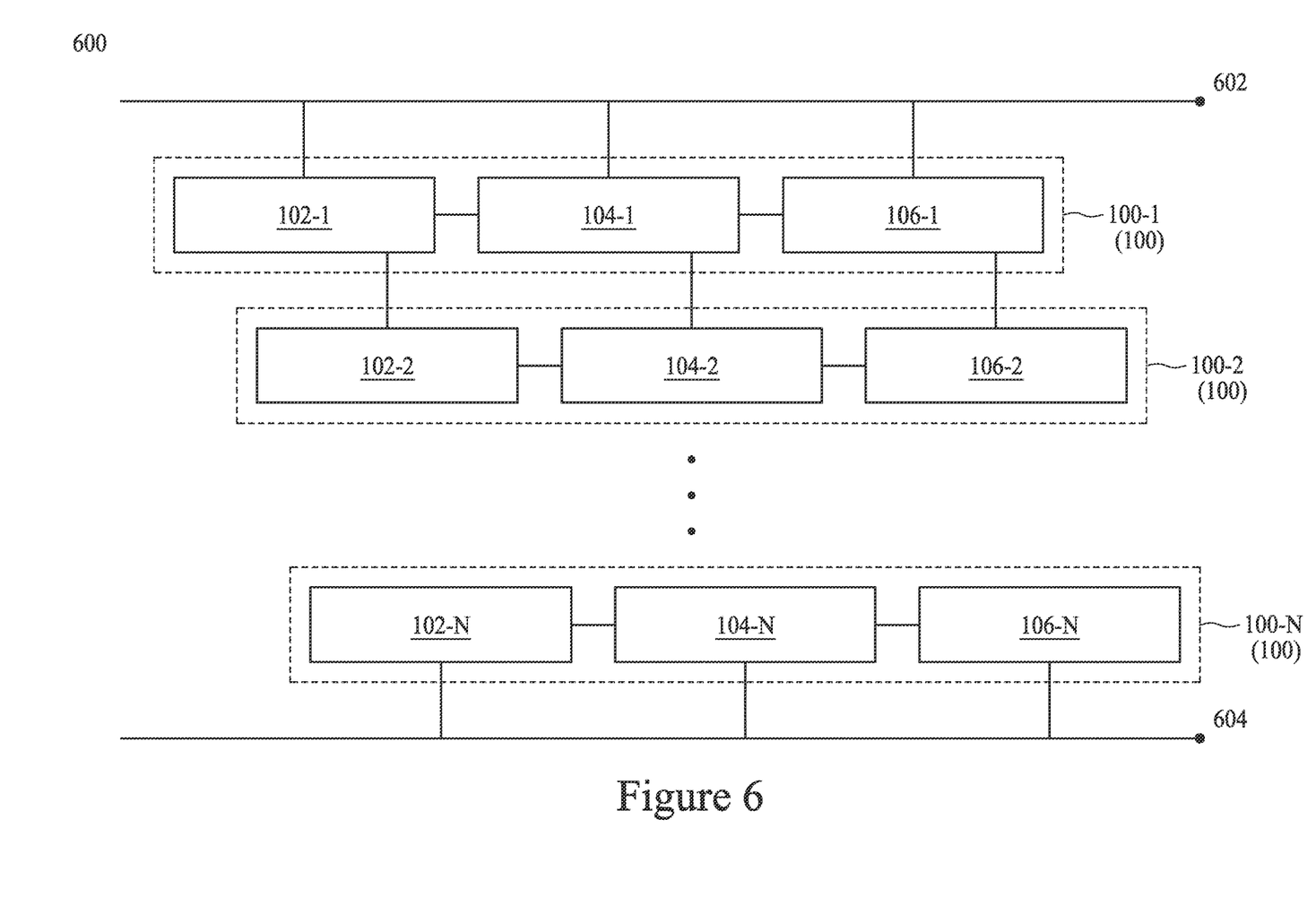
FIG. 6 illustrates an exemplary block diagram of a high voltage level application in which the cascaded ESD protection circuit of FIG. 1 is used, in accordance with some embodiments.

FIG. 6 illustrates an exemplary block diagram showing the ESD circuit 100 can be used in a high voltage level application 600, in accordance with some embodiments. As shown, the high voltage level application 600 includes at least two power supply buses 602 and 604, wherein the power supply bus 602 may be configured to provide a high voltage (e.g., $N \times VDD$), and the voltage supply bus 604 may be configured to provide a VSS (e.g., a ground voltage). In some embodiments, "N," as used herein, may be a positive integer or fraction. When used in such a high voltage level application 600, in some embodiments, plural ESD circuits 100 may be serially coupled from one to another between the power supply buses 602 and 604, for example, 100-1, 100-2, 100-N, etc., each of which is substantially similar to the ESD circuit 100 of FIG. 1. Although only three ESD circuits 100-1, 100-2, and 100-N are shown in FIG. 6, it is understood that any desired number of ESD circuits 100 may be coupled between the power supply buses 602 and 604 for such a high voltage application 600.

More specifically, in some embodiments, the ESD circuit 100-1 includes respective detection circuit 102-1, delay element circuit 104-1, and bypass circuit 106-1; the ESD circuit 100-2 includes respective detection circuit 102-2, delay element circuit 104-2, and bypass circuit 106-2; and the ESD circuit 100-N includes respective detection circuit 102-N, delay element circuit 104-N, and bypass circuit 106-N. Each of the detection circuits 102-1, 102-2, and 102-N is substantially similar to the detection circuit 102 as mentioned above; each of the delay element circuits 104-1, 104-2, and 104-N is substantially similar to the delay element circuit 104 as mentioned above; and each of the bypass circuits 106-1, 106-2, and 106-N is substantially similar to the bypass circuit 106 as mentioned above.

Accordingly, in some embodiments, the ESD circuit 100-1 is coupled to the power supply bus 602; the ESD circuit 100-2 is coupled to the power supply bus 602 through the ESD circuit 100-1; and the ESD circuit 100-N is coupled to the power supply bus 602 through the ESD circuits 100-1 and 100-2 and one or more ESD circuits coupled therebetween, if any. Similarly, the ESD circuit 100-N is coupled to the power supply bus 604; the ESD circuit 100-2 is coupled to the power supply bus 604 through the ESD circuit 100-N and one or more ESD circuits coupled therebetween, if any; and the ESD circuit 100-1 is coupled to the power supply bus 604 through the ESD circuits 100-2 and 100-N and one or more ESD circuits coupled therebetween, if any.

Figure 7:
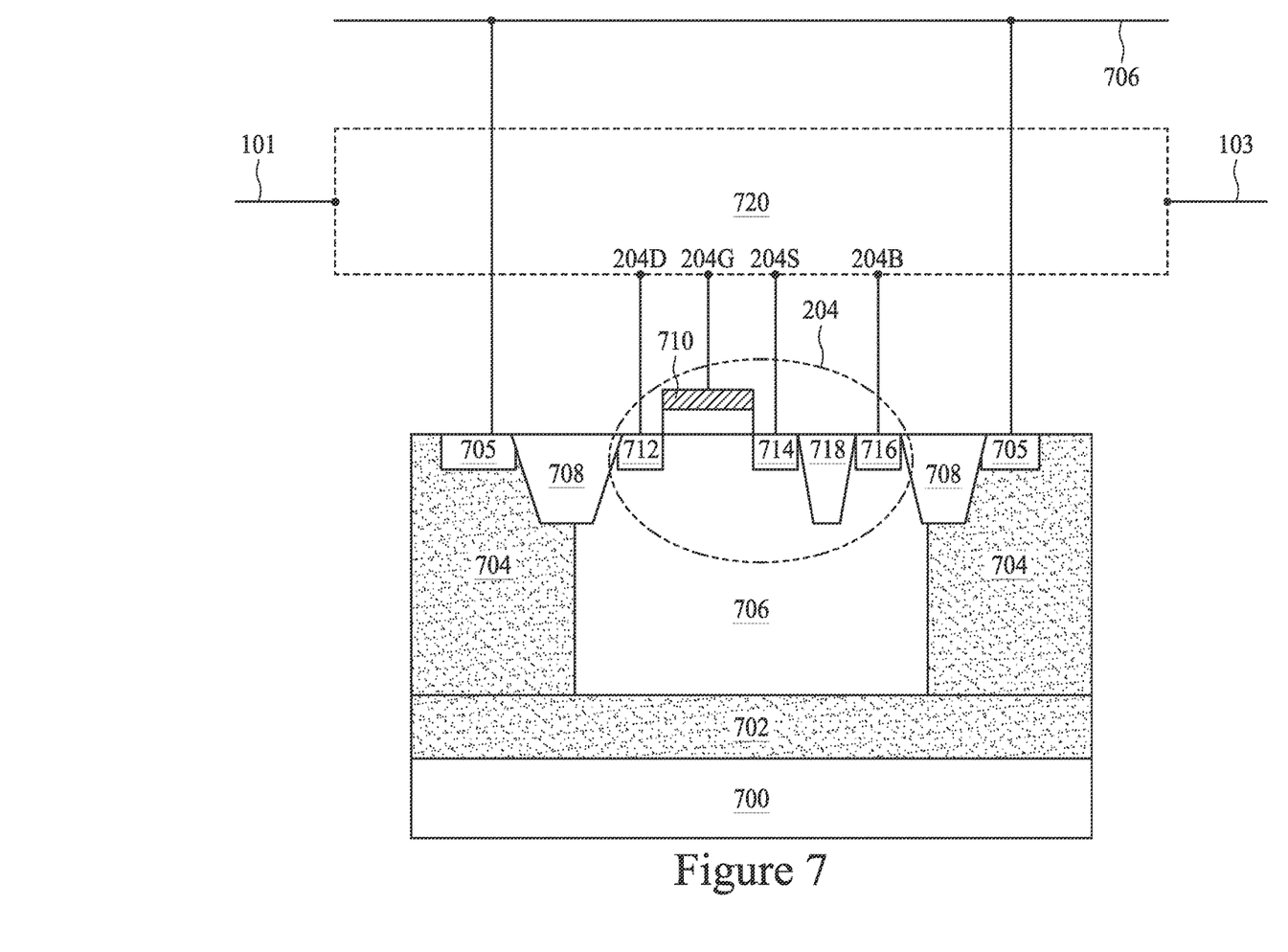
FIG. 7 illustrates an exemplary cross-sectional view of a portion of the cascaded ESD protection circuit of FIG. 1, in accordance with some embodiments.

FIG. 7 illustrates a cross-sectional view of part of the ESD circuit 100 at a semiconductor fabrication level, in accordance with some embodiments. It is noted that the cross-sectional view shown in FIG. 7 is merely provided as an example to illustrate how the elements (e.g., 202 to 214) of the ESD circuit 100 are formed above a DNW (deep n-type well) 702 and surrounded by an n-type guard ring 704, in accordance with some embodiments. Thus, for brevity, only the transistor 204 is shown in FIG. 7, and it is understood each of other elements (e.g., 202, 206, 208, 210, 212, and 214) of the ESD circuit 100 can also be formed above the DNW 702 and surrounded by the n-type guard ring 704.

As shown in the illustrated embodiment of FIG. 7, the DNW 702 is disposed above a p-type substrate 700. The n-type guard ring 704 are disposed above the DNW 702. It should be understood that the n-type guard ring 704 may be formed as a single n-type well that surrounds the DNW 702 but is shown as two separate sections in the cross-sectional view of FIG. 7 for convenience. An n+ doped (heavily n-type doped) region 705 is formed above the guard ring 704 as the guard ring 704's contact. In some embodiments, one or more shallow trench isolation (STI) features 708 may be formed adjacent to each of the n+ doped contacts 705. As such, an isolated p-type well 706 may be formed and surrounded by the DNW 702, the guard ring 704, and the STI features 708.

In some embodiments, the isolated p-type well 706 may be used to form various elements (e.g., 202 to 214) of the ESD circuit 100. As described above, by forming the ESD circuit 100 above such a DNW 702, the ESD circuit 100's ESD protection ability may be improved. As a representative example, the transistor 204 is formed on such a p-type well 706 (partially surrounded by the DNW 702). More specifically, the gate end 204G, drain end 204D, source end 204G, and body end 204B of the transistor 204 are implemented by a gate stack 710, an n+ doped region 712, an n+ doped region 714, and a p+ doped (heavily p-type doped) region 716, respectively, wherein the n+ doped region 714 and the p+ doped region 716 is laterally separated by another STI feature 718.

In some embodiments, the gate end 204G, drain end 204D, source end 204G, and body end 204B of the transistor 204 may be coupled to the respective power supply bus (e.g., 101 and 103) through respective metal interconnection structures, which are collectively shown as 720 in FIG. 7, for purposes of brevity. Further, as mentioned above, the DNW 702 is typically coupled to a power supply bus with a highest voltage level, e.g., 706. In some embodiments, the voltage level provided by the power supply bus 706 may be substantially higher than the voltage level propagated through the VDD bus 101 and VSS bus 103.

In an embodiment, an electrostatic discharge (ESD) protection circuit is coupled between first and second power supply buses. The ESD protection circuit includes a detection circuit; a pull-up circuit, coupled to the detection circuit, comprising at least a first n-type transistor; a pull-down circuit, coupled to the pull-up circuit, comprising at least a second n-type transistor; and a bypass circuit, coupled to the pull-up and pull-down circuits, wherein the detection circuit is configured to detect whether an ESD event is present on either the first or the second bus so as to cause the pull-up and pull-down circuits to selectively enable the bypass circuit for providing a discharging path between the first and second power supply buses.

In another embodiment, an electrostatic discharge (ESD) protection circuit, coupled between first and second power supply buses, includes a detection circuit comprising a first resistor and a capacitor coupled to each other at a first node; a pull-up circuit, coupled to the detection circuit, comprising at least a first n-type transistor; a pull-down circuit, coupled to the pull-up circuit, comprising a second n-type transistor; and a bypass circuit, coupled to the pull-up and pull-down circuits, wherein the detection circuit is configured to detect whether an ESD event is present on either the first or the second bus so as to cause the pull-up and pull-down circuits to selectively enable the bypass circuit for providing a discharging path between the first and second power supply buses.

Yet in another embodiment, a method to operate an electrostatic discharge (ESD) protection circuit includes detecting a presence of an ESD pulse signal on a first power supply bus; delaying the ESD pulse signal to charge a first node to cause the first node to be at a low logic state thereby turning off first and second n-type transistors; charging a second node to cause the second node to be at a high logic state through a first resistor thereby turning on a third n-type transistor; charging a third node to cause the third node to be at the high logic state through the third n-type transistor thereby turning on a fourth n-type transistor coupled between the first power supply bus and a second power supply bus so as to discharge the ESD pulse signal from the first power supply bus to the second power supply bus.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) protection circuit coupled between first and second power supply buses, comprising:
    a detection circuit coupled to the first and second power supply buses;
    a pull-up circuit comprising a first resistor having a first end coupled to the first power supply bus and second end coupled to a second node of the ESD protection circuit;
    a pull-down circuit, coupled to the pull-up circuit, the pull-down circuit comprising a first transistor coupled to a first node of the ESD protection circuit, a drain end coupled to a third node of the ESD protection circuit, and a source end and a body end coupled to the second power supply bus; and
    a bypass circuit, coupled to the pull-up and pull-down circuits at the third node, wherein the detection circuit is configured to detect whether an ESD event is present on either the first or the second bus so as to cause the pull-up and pull-down circuits to selectively enable the bypass circuit for providing a discharging path between the first and second power supply buses, such that when an ESD pulse signal is detected on the first power supply bus, the first node is configured to be at first logic state, and the second and third nodes are charged to a second logic state so as to discharge the ESD pulse signal from the first power supply bus to the second power supply.

2. The circuit of claim 1, wherein:
    the detection circuit comprises:
    a second resistor having a first end coupled to the first power supply bus and a second end coupled to the first node of the ESD protection circuit;
    a second transistor having a gate end coupled to the first node, and a source end, a drain end and a body end coupled to the second power supply bus; and
    the bypass circuit comprises a third transistor having a gate coupled to the third node, a drain coupled to the first power supply bus and a source coupled to the second power supply bus.

3. The circuit of claim 2, wherein the first resistor and the first transistor provide a resistor-capacitor (RC) delay when the first node is at the low logic state and the ESD pulse signal is present on the first power supply bus.

4. The circuit of claim 2, wherein:
    the first transistor comprises a first n-type transistor; and
    the second transistor comprises a second n-type transistor.

5. The circuit of claim 4, wherein the second n-type transistor of the pull-down circuit is gated by the voltage level at the first node.

6. The circuit of claim 4, wherein the pull-up circuit comprises a third n-type transistor, and wherein the second n-type transistor of the pull-down circuit and the third n-type transistor of the pull-up circuit is coupled at the third node.

7. The circuit of claim 2, wherein the pull-up circuit further comprises:
   a fourth transistor having a gate end coupled to the first node, a drain end coupled to the second node, and source and body ends coupled to the second power supply bus; and
   a fifth transistor having a gate end coupled to the second node, a drain end coupled to the second node, and source and body ends coupled to the second power supply bus.

8. The circuit of claim 7, wherein the fourth and fifth transistors comprise fourth and fifth n-type transistors, respectively.

9. The circuit of claim 1, wherein the first power supply bus is configured to provide a first supply voltage and the second power supply bus is configured to provide a second supply voltage, the first supply voltage being higher than the second supply voltage.

10. An electrostatic discharge (ESD) protection circuit coupled between first and second power supply buses, comprising:
   a detection circuit comprising a first node;
   a pull-up circuit, coupled to the detection circuit, the pull-up circuit comprising a first transistor;
   a pull-down circuit, coupled to the pull-up circuit, the pull-up circuit comprising a second transistor, wherein the second transistor is gated by a voltage level at the first node; and
   a bypass circuit, coupled to the pull-up and pull-down circuits,
   wherein the detection circuit is configured to detect whether an ESD event is present on either the first or the second bus so as to cause the pull-up and pull-down circuits to selectively enable the bypass circuit for providing a discharging path between the first and second power supply buses, and wherein the detection circuit is configured to delay a pulse signal provided on the first bus from turning on at least one of the pull-up and pull-down circuits.

11. The circuit of claim 10, wherein the detection circuit comprises a first resistor and a capacitor coupled to each other at the first node, and the capacitor comprises a transistor that comprises a drain end, a source end, and a body end respectively coupled to the second power supply bus.

12. The circuit of claim 10, wherein:
   the first transistor comprises a first n-type transistor;
   the second transistor comprises a second n-type transistor; and
   the pull-up circuit, coupled between the first and second power supply buses, further comprises a third n-type transistor and a second resistor, and wherein the first n-type transistor is gated by a voltage level at the first node, and the third n-type transistor is gated by a voltage level at a second node that is commonly coupled by the first n-type transistor and the second resistor.

13. The circuit of claim 12, wherein the second n-type transistor is coupled between the second resistor and the second power supply bus.

14. The circuit of claim 12, wherein the second n-type transistor of the pull-down circuit and the third n-type transistor of the pull-up circuit is coupled at a third node.

15. The circuit of claim 14, wherein the bypass circuit comprises a fourth n-type transistor that is gated by a voltage level as the third node.

16. The circuit of claim 15, wherein when the ESD event is present on the first power supply bus, the voltage level at the first node corresponds to a low logic state such that the first n-type transistor of the pull-up circuit and the third n-type transistor of the pull-down circuit are turned off, the voltage level at the second node corresponds to a high logic state such that the second n-type transistor of the pull-up circuit is turned on, and the voltage level at the third node corresponds to a high logic state to turn on the fourth n-type transistor so as to provide the discharging path.

17. The circuit of claim 10, wherein the first power supply bus is configured to provide a positive supply voltage and the second power supply bus is configured to provide a ground voltage.

18. A method to operate an electrostatic discharge (ESD) protection circuit, comprising:
   detecting a presence of an ESD pulse signal on a first power supply bus;
   delaying the ESD pulse signal to charge a first node to cause the first node to be at a first logic state;
   charging a second node to cause the second node to be at a second logic state different from the first logic state;
   charging a third node to cause the third node to be at the second logic state so as to discharge the ESD pulse signal from the first power supply bus to the second power supply bus, wherein charging the third node to the second logic state provides a discharge path between the first and second power supply buses.

19. The method of claim 18, further comprising:
   delivering a positive supply voltage from the first power supply bus to a coupled circuit while the ESD pulse signal is discharged from the first power supply bus to the second power supply bus.

20. The method of claim 18, further comprising:
   detecting a lack of the ESD pulse signal on the first power supply bus;
   charging the first node to cause the first node to be at the high logic state;
   and
   discharging the third node to cause the third node to be at the low logic state.

* * * * *